United States Patent
Jo et al.

(10) Patent No.: US 9,158,081 B2
(45) Date of Patent: Oct. 13, 2015

(54) SEMICONDUCTOR PACKAGE WITH AN OPTICAL SIGNAL PATH, MEMORY CARD INCLUDING THE SAME, AND ELECTRONIC SYSTEM INCLUDING THE SAME

(71) Applicant: SK HYNIX INC., Icheon (KR)

(72) Inventors: Tae Ho Jo, Gwangju (KR); Taek Joong Kim, Seoul (KR); Wan Choon Park, Daejeon (KR); Sung Su Park, Yongin (KR)

(73) Assignee: SK HYNIX INC., Icheon (KR)

( * ) Notice: Subject to any disclaimer, the term of this patent is extended or adjusted under 35 U.S.C. 154(b) by 1 day.

(21) Appl. No.: 14/089,487

(22) Filed: Nov. 25, 2013

(65) Prior Publication Data

US 2015/0010269 A1  Jan. 8, 2015

(30) Foreign Application Priority Data

Jul. 4, 2013  (KR) .................... 10-2013-0078446

(51) Int. Cl.
*G02B 6/12*  (2006.01)
*G02B 6/26*  (2006.01)
*G02B 6/43*  (2006.01)

(52) U.S. Cl.
CPC .......................................... *G02B 6/43* (2013.01)

(58) Field of Classification Search
CPC ................................... G02B 6/12; G02B 6/26
USPC ...................................................... 385/14, 50
See application file for complete search history.

(56) References Cited

U.S. PATENT DOCUMENTS

| | | | |
|---|---|---|---|
| 4,611,886 A * | 9/1986 | Cline et al. ..................... 385/92 |
| 5,237,434 A * | 8/1993 | Feldman et al. ................ 359/19 |
| 5,898,909 A * | 4/1999 | Yoshihara et al. .............. 455/73 |
| 6,266,712 B1 * | 7/2001 | Henrichs .......................... 710/8 |
| 6,477,286 B1 * | 11/2002 | Ouchi ............................. 385/14 |
| 2002/0028045 A1 * | 3/2002 | Yoshimura et al. ............ 385/50 |
| 2002/0039464 A1 * | 4/2002 | Yoshimura et al. ............ 385/14 |
| 2002/0097962 A1 * | 7/2002 | Yoshimura et al. ............ 385/50 |
| 2003/0201462 A1 * | 10/2003 | Pommer et al. ............... 257/200 |
| 2004/0184737 A1 * | 9/2004 | Oono et al. ...................... 385/52 |
| 2005/0023656 A1 * | 2/2005 | Leedy ............................ 257/678 |
| 2005/0156310 A1 * | 7/2005 | Benner et al. ................. 257/712 |
| 2005/0224946 A1 * | 10/2005 | Dutta ............................. 257/686 |
| 2005/0230853 A1 * | 10/2005 | Yoshikawa ............. 257/E25.032 |
| 2006/0012967 A1 * | 1/2006 | Asai et al. ..................... 361/764 |
| 2006/0050493 A1 | 3/2006 | Hamasaki et al. |
| 2008/0121783 A1 * | 5/2008 | Amano ...................... 250/208.1 |
| 2009/0185808 A1 * | 7/2009 | Kishima ........................ 398/118 |
| 2011/0133217 A1 * | 6/2011 | Hakamata et al. .............. 257/88 |
| 2011/0165707 A1 * | 7/2011 | Lott et al. ........................ 438/27 |
| 2012/0121272 A1 * | 5/2012 | Kropp ............................ 398/182 |
| 2013/0214182 A1 * | 8/2013 | Okawa et al. ............. 250/559.01 |
| 2013/0279844 A1 * | 10/2013 | Na et al. .......................... 385/14 |
| 2013/0329397 A1 * | 12/2013 | Shimizu et al. ................. 362/84 |
| 2014/0232288 A1 * | 8/2014 | Brandes et al. ............... 315/250 |
| 2014/0232289 A1 * | 8/2014 | Brandes et al. ............... 315/250 |
| 2014/0367633 A1 * | 12/2014 | Bibl et al. ........................ 257/13 |
| 2015/0010269 A1 * | 1/2015 | Jo et al. .......................... 385/14 |

FOREIGN PATENT DOCUMENTS

JP   2005-266623 A   9/2005

* cited by examiner

*Primary Examiner* — Kaveh Kianni

(57) ABSTRACT

A semiconductor package includes a substrate and an optical communication part. A first chip stack part and a second chip stack part are disposed over the substrate and are separate from each other, and the optical communication part is disposed in a cavity formed in the substrate to provide an optical signal path between the first and second chip stack parts.

8 Claims, 6 Drawing Sheets

SEMICONDUCTOR PACKAGE WITH AN OPTICAL SIGNAL PATH, MEMORY CARD INCLUDING THE SAME, AND ELECTRONIC SYSTEM INCLUDING THE SAME

CROSS-REFERENCE TO RELATED APPLICATION

The present application claims priority under 35 U.S.C 119(a) to Korean Application No. 10-2013-0078446, filed on Jul. 4, 2013, in the Korean intellectual property Office, which is incorporated herein by reference in its entirety as set forth in full.

BACKGROUND

1. Technical Field

Embodiments of the present disclosure relate to a semiconductor package and, more particularly, to a semiconductor package with optical signal paths, a memory card including the same, and an electronic system including the same.

2. Related Art

Semiconductor packages capable of processing a large amount of data are increasingly in demand with the development of smaller electronic systems such as mobile systems. To meet such a demand, it is necessary to increase the degree of integration of semiconductor devices used in electronic systems. However, there are some limitations in increasing the degree of integration of semiconductor devices.

Recently, three dimensional semiconductor devices that use vertical gate transistors instead of planar gate transistors have been proposed to increase the degree of integration of semiconductor devices. However, there are a lot of technical difficulties in developing three dimensional semiconductor devices.

Accordingly, as an alternative, three dimensional semiconductor packages are considered as candidates for high performance semiconductor packages capable of processing a large amount of data. For example, a stack package, which includes a plurality of stacked semiconductor devices (also referred to as semiconductor chips), has been proposed to process a large amount of data.

A high capacity semiconductor package may be fabricated in a stack package form. That is, the high capacity semiconductor package is fabricated by stacking a plurality of semiconductor chips. In such a case, the number of signal paths for driving the semiconductor chips may increase in proportion to the number of the stacked semiconductor chips. Further, as semiconductor chips are scaled down, distances between electronic signal paths of the semiconductor chips are also reduced, which may cause data distortion due to skewed interconnections and interferences between signals loaded on the interconnections.

Semiconductor devices employed in an electronic system include various electronic circuit elements. The electronic circuit elements are integrated in and/or on a semiconductor substrate to constitute the semiconductor device (also referred to as a semiconductor chip or a semiconductor die). Each semiconductor chip may be mounted on a package substrate and encapsulated to form a semiconductor chip package. The package substrate may have interconnection lines including power lines for supplying electric power to semiconductor chips and signal lines for transmitting data signals. The interconnection lines may be disposed in and/or on a core layer including a dielectric layer. The package substrate may be a printed circuit board (PCB).

SUMMARY

Various embodiments are directed to a semiconductor package with optical signal paths, a memory card including the same, and an electronic system including the same.

According to some embodiments, a semiconductor package includes a substrate and an optical communication part. A first chip stack part and a second chip stack part are disposed on the substrate, and the optical communication part is disposed in a cavity formed in the substrate to provide an optical signal path between the first and second chip stack parts.

According to further embodiments, a semiconductor package includes an upper substrate including a first surface on which a first chip stack part and a second chip stack part are disposed and a second surface which has a concave groove to provide a cavity, a lower substrate including a first surface attached to the second surface of the upper substrate opposite to the first and second chip stack parts, and an optical communication part disposed on the first surface of the lower substrate in the cavity to provide an optical path between the first and second chip stack parts.

According to further embodiments, a memory card includes a semiconductor package. The semiconductor package includes a substrate and an optical communication part. A first chip stack part and a second chip stack part are disposed on the substrate, and the optical communication part is disposed in a cavity formed in the substrate to provide an optical signal path between the first and second chip stack parts.

According to further embodiments, a memory card includes a semiconductor package. The semiconductor package includes an upper substrate including a first surface on which a first chip stack part and a second chip stack part are disposed and a second surface which has a concave groove to provide a cavity, a lower substrate including a first surface attached to the second surface of the upper substrate opposite to the first and second chip stack parts, and an optical communication part disposed on the first surface of the lower substrate in the cavity to provide an optical path between the first and second chip stack parts.

According to further embodiments, an electronic system includes a semiconductor package. The semiconductor package includes a substrate and an optical communication part. A first chip stack part and a second chip stack part are disposed on the substrate, and the optical communication part is disposed in a cavity formed in the substrate to provide an optical signal path between the first and second chip stack parts.

According to further embodiments, an electronic system includes a semiconductor package. The semiconductor package includes an upper substrate including a first surface on which a first chip stack part and a second chip stack part are disposed and a second surface which has a concave groove to provide a cavity, a lower substrate including a first surface attached to the second surface of the upper substrate opposite to the first and second chip stack parts, and an optical communication part disposed on the first surface of the lower substrate in the cavity to provide an optical path between the first and second chip stack parts.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention.

It will also be understood that when an element is referred to as being "on", "above", "below", or "under" another element, it can be directly "on", "above", "below", or "under" the other element, respectively, or intervening elements may also be present. Accordingly, the terms such as "on", "above", "below", or "under" which are used herein are for the purpose of describing particular embodiments only and are not intended to limit the present invention.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between", "adjacent" versus "directly adjacent", "on" versus "directly on").

Additionally, it will be understood that the term "chip" used herein may correspond to a semiconductor chip, for example, a memory chip, a semiconductor substrate, or a logic chip. The memory chip may include memory circuits such as dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PCRAM) circuits which are integrated on and/or in a substrate. The logic chip may include logic circuits which are integrated on and/or in a substrate. The semiconductor substrate may include the memory circuits or the logic circuits thereon and/or therein. In some cases, the term "chip" used herein may be construed as a die or a substrate in which integrated circuits are formed.

Figure 1:
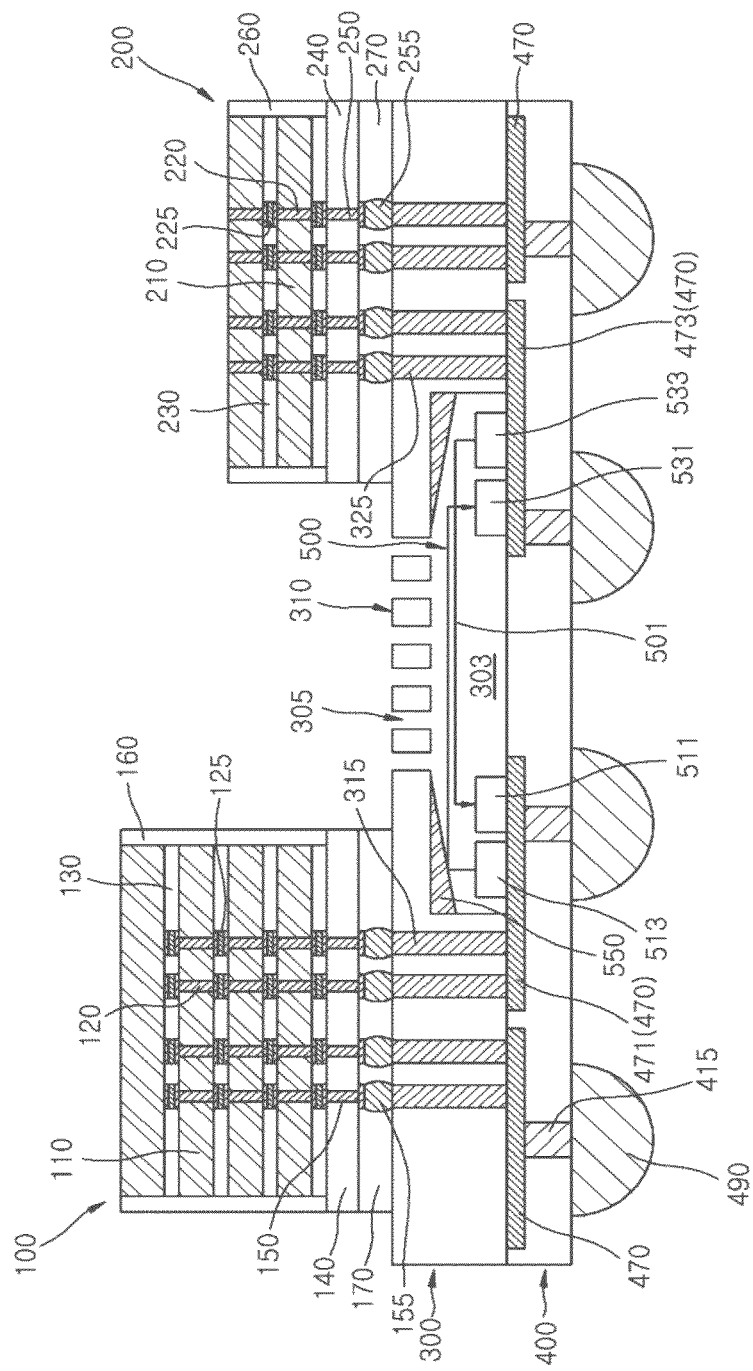
FIG. 1 is a cross-sectional view illustrating a semiconductor package according to an embodiment of the present invention.

FIG. 1 illustrates a semiconductor package according to an embodiment of the present invention. The semiconductor package includes upper and lower substrates 300 and 400 sequentially stacked, a first chip stack part 100 stacked over a first portion of the upper substrate 300, and a second chip stack part 200 stacked over a second portion of the upper substrates 300.

The first chip stack part 100 includes at least one first semiconductor chip 110. In the event that the first chip stack part 100 includes more than one first semiconductor chip 110, the first semiconductor chips 110 are sequentially stacked over the upper and lower substrates 300 and 400. In such an embodiment, the first semiconductor chips 110 are electrically coupled to each other. At least one of the first semiconductor chips 110 may be a memory chip that stores data. In an embodiment, at least one of the first semiconductor chips 110 may be a DRAM chip.

The first semiconductor chips 110 may be electrically coupled to each other using interconnectors. In an embodiment, each of the first semiconductor chips 110 includes first through electrodes 120, such as through silicon vias (TSVs), penetrating a body thereof. Each first through electrode 120 of one of the first semiconductor chip 110 is electrically coupled to a corresponding first through electrode 120 of another one of the first semiconductor chips 110 by a first joint conductor 125, such as a solder layer. The first through electrodes 120 may be electrically coupled to internal circuits of the first semiconductor chips 110 through redistributed lines (RDLs) disposed on surfaces of the first semiconductor chips 110. In another embodiment, the first semiconductor chips 110 are electrically coupled to each other by bonding wires instead of the first through electrodes 120. However, in such a case, it may be difficult to reduce a size of the semiconductor package. Accordingly, the first through electrode 120 may be a more attractive candidate for reducing the size of the semiconductor package.

In an embodiment, the first semiconductor chips 110 are stacked such that the first through electrodes 120 of the first semiconductor chips 110 are vertically aligned with each other. The first semiconductor chips 110 are electrically insulated from each other by a first adhesive layer 130 disposed therebetween.

A stack structure including the first semiconductor chips 110 is mounted on a first chip stack substrate 140. The first chip stack substrate 140 may be a printed circuit board (PCB) or an interposer substrate. The first chip stack substrate 140 may include interconnection lines and/or vias constituting a substrate circuit. In an embodiment, the first chip stack substrate 140 includes first through vias 150, such as through substrate vias, penetrating a body thereof. The first through vias 150 electrically couple the stack structure including the first semiconductor chips 110, which is stacked over a top surface of the first chip stack substrate 140, to first chip stack connection terminals 155 such as solder balls attached on a bottom surface of the first chip stack substrate 140. Thus, the first chip stack connection terminals 155 and the first semiconductor chips 110 are disposed on opposite sides of the first chip stack substrate 140.

In an embodiment, the first semiconductor chips 110 are protected by a first protection layer 160. The first protection layer 160 may include an epoxy molding compound (EMC) material. The first protection layer 160 is disposed on sidewalls of the first semiconductor chips 110 so that the first semiconductor chips 110 are surrounded by the first protection layer 160.

The first chip stack part 100 is electrically coupled to the upper substrate 300 through the first chip stack connection terminals 155. A first insulation layer 170 is disposed between the first chip stack part 100 and the upper substrate 300 and is formed to electrically insulate the first chip stack connection terminals 155 from each other.

The second chip stack part 200 is configured to include at least one second semiconductor chip 210. In the event that the second chip stack part 200 includes more than one second semiconductor chip 210, the second semiconductor chips 210 are sequentially stacked over the upper and lower substrates 300 and 400. At least one of the second semiconductor chips 210 may be a logic chip. In an embodiment, if the first semiconductor chips 110 are memory chips such DRAM chips, the second semiconductor chips 210 are controller chips that control operations of the first semiconductor chips 110.

The second semiconductor chips 210 of the second chip stack part 200 may be electrically coupled to each other using interconnectors. In an embodiment, each of the second semiconductor chips 210 includes second through electrodes 220, such as through silicon vias (TSVs), penetrating a body thereof. Each second through electrode 220 of one of the second semiconductor chips 210 is electrically coupled to a corresponding second through electrode 220 of another one of the second semiconductor chips 210 by a second joint conductor 225, such as a solder layer. The second through electrodes 220 may be electrically coupled to internal circuits of the second semiconductor chips 210 through redistributed lines (RDLs) disposed on surfaces of the second semiconductor chips 210. In another embodiment, the second semiconductor chips 210 are electrically coupled to each other by bonding wires instead of the second through electrodes 220. However, in such a case, it may be difficult to reduce the size of the semiconductor package. Accordingly, the second through electrode 220 may be a more attractive candidate for reducing the size of the semiconductor package.

In an embodiment, the second semiconductor chips 210 are stacked such that the first through electrodes 220 of the plurality of second semiconductor chips 210 are vertically aligned with each other. The plurality of second semiconductor chips 210 may be electrically insulated from each other by a second adhesive layer 230 disposed therebetween.

A stack structure including the second semiconductor chips 210 is mounted on a second chip stack substrate 240. The second chip stack substrate 240 may be a printed circuit board (PCB) or an interposer substrate. The second chip stack substrate 240 may include interconnection lines and/or vias to form a substrate circuit. In an embodiment, the second chip stack substrate 240 includes second through vias 250, such as through substrate vias, penetrating a body thereof. The second through vias 250 electrically couple the stack structure including the second semiconductor chips 210, which is stacked over a top surface of the second chip stack substrate 240, to second chip stack connection terminals 255 such as solder balls attached on a bottom surface of the second chip stack substrate 240. Thus, the second chip stack connection terminals 255 and the second semiconductor chips 210 are disposed on opposite sides of the second chip stack substrate 240.

In an embodiment, the second semiconductor chips 210 are protected by a second protection layer 260. The second protection layer 260 may include an epoxy molding compound (EMC) material. The second protection layer 260 may be disposed on sidewalls of the second semiconductor chips 210 so that the second semiconductor chips 210 are surrounded by the second protection layer 260.

The second chip stack part 200 is electrically coupled to the upper substrate 300 through the second chip stack connection terminals 255. A second insulation layer 270 is disposed between the second chip stack part 200 and the upper substrate 300 and is formed to electrically insulate the second chip stack connection terminals 255 from each other.

The first and second chip stack parts 100 and 200 provided over the upper and lower substrates 300 and 400 are disposed to be spaced apart from each other. The upper and lower substrates 300 and 400 include signal paths that electrically and optically couple the first chip stack part 100 to the second chip stack part 200. The signal paths of the upper and lower substrates 300 and 400 include an electrical signal path part and an optical signal path part.

The electrical signal path part corresponds to an electrical connection structure including interconnection lines 470 and interconnection vias 315 and 325. The interconnection vias 315 and 325 are disposed in the upper substrate 300, and the interconnection lines 470 are disposed in the lower substrate 400.

The optical signal path part is provided by an optical communication part 500. The optical communication part 500 transmits optical signals to the optical signal path part or receives the optical signals outputted from the optical signal path part. The optical communication part 500 converts optical signals into electrical signals to transmit the electrical signals to the electrical signal path part or converts electrical signals into optical signals to transmit the optical signals to the optical signal path part.

The optical communication part 500 includes a first optical transceiver and a second optical transceiver. The first optical transceiver includes a first optical receiver 511 and a first optical transmitter 513, and the second optical transceiver includes a second optical receiver 531 and a second optical transmitter 533. The first optical transceiver 511 and 513 is electrically coupled to the first chip stack part 100 to communicate with the first chip stack part 100 using electrical signals, and the second optical transceiver 531 and 533 is electrically coupled to the second chip stack part 200 to communicate with the second chip stack part 200 using electrical signals. The optical communication part 500 further includes an optical signal path 501 coupled between the first optical transceivers 511 and 513 and the second optical transceiver 531 and 533. Thus, the first optical transceiver 511 and 513 communicates with the second optical transceiver 531 and 533 through the optical signal path 501. The first optical receiver 511 receives an optical signal from the second optical transmitter 533 through the optical signal path 501, and the second optical receiver 531 receives an optical signal from the first optical transmitter 513 through the optical signal path 501.

The first optical transceiver 511 and 513 electrically communicates with the first chip stack part 100 through the electrical connection structure 471 (470), 315, and the second optical transceiver 531 and 533 electrically communicates with the second chip stack part 200 through the electrical connection structure 473 (470) and 325. As such, the first chip stack part 100 and the second chip stack part 200 electrically and optically communicate with each other through the electrical signal path including the electrical connection structure 470, 315, and 325 in the upper and lower substrates 300 and 400 and the optical signal path 501 in the optical communication part 500.

When the second semiconductor chips 210 act as controller chips (e.g., logic chips) that control the operations of the first semiconductor chips 110 (e.g., memory chips such as DRAM chips), electrical signals (e.g., control signals) outputted from the second semiconductor chips 210 are transmitted to the second optical transmitter 533 through the second through substrate vias 325 penetrating the upper substrate 300 and the interconnection line 473 disposed between the upper substrate 300 and the lower substrate 400.

The second optical transmitter 533 converts the electrical signals, which are outputted from the second semiconductor chips 210, into optical signals and transmits the optical signals to the first optical receiver 511 through the optical signal path 501. The first optical receiver 511 converts the optical signals transmitted from the second optical transmitter 533 into electrical signals and transmits the electrical signals to the first semiconductor chips 110 through the interconnection line, 471 disposed between the upper substrate 300 and the lower substrate, and the first through substrate vias 315 penetrating the upper substrate 300.

Each of the first optical receiver 511, the first optical transmitter 513, the second optical receiver 531, and the second optical transmitter 533, which form the optical communication part 500, may include an optical element such as a photo diode for transmission (or reception) of the optical signals and conversion of the optical signals (or the electrical signals) into the electrical signals (or the optical signals).

The optical communication part 500 provides an optical signal path between the first chip stack part 100 and the second chip stack part 200. Thus, the optical communication part 500 may suppress or prevent thermal stress by reducing the amount of electrical resistance that is generated in the semiconductor package. As a result, the thermal stability of the semiconductor package may be improved because of the presence of the optical communication part 500. Further, since the transmission speed of optical signals is faster than that of electrical signals, the optical communication part 500 employed in the semiconductor package may improve the operation speed of the semiconductor package.

Moreover, if signal paths between the first and second chip stack parts 100 and 200 are implemented using electrical signal paths and the semiconductor package is scaled down to reduce a distance between the electrical signal paths, the semiconductor package may be susceptible to interference between the electrical signals loaded on two adjacent electrical signal paths. However, according to an embodiment of the present invention, the first and second chip stack parts 100 and 200 can optically communicate with each other through the optical communication part 500 without use of electrical signal paths. Thus, the reliability of the semiconductor package employing the optical communication part 500 may be also improved with suppression of interference or distortion of signals.

In an embodiment, the upper substrate 300 includes a cavity 303 therein between the first and second chip stack parts 100 and 200. The optical communication part 500 is disposed in the cavity 303. The cavity 303 is also provided between an upper portion, e.g., a separation part 310, of the upper substrate 300 and the lower substrate 400. In an embodiment, the separation part 310 connects the first and second portions of the upper substrate 300 over which the first and second chip stack parts 100 and 200 are disposed, respectively. Thus, as shown in FIG. 1, the optical communication part 500 is disposed at a bottom portion of the cavity 303.

In an embodiment, the optical communication part 500 further includes a plurality of total reflectors 550, for example, a pair of total reflectors, attached to a roof of the cavity 303, to provide the optical signal path 501. The total reflectors 550 are disposed to be aligned with the first optical receiver 511, the first optical transmitter 513, the second optical receiver 531, and the second optical transmitter 533. As a result, an optical signal outputted from the second optical transmitter 533 may be totally reflected on one of the total reflectors 550 to travel toward the other of the total reflectors 550, and then totally reflected on the other of the total reflectors 550 to travel toward the first optical receiver 511. In addition, an optical signal outputted from the first optical transmitter 513 may be totally reflected on the other of the total reflectors 550 to travel toward the one of the total reflectors 550, and is then totally reflected on the one of the total reflectors 550 to travel toward the second optical receiver 531.

Figure 2:
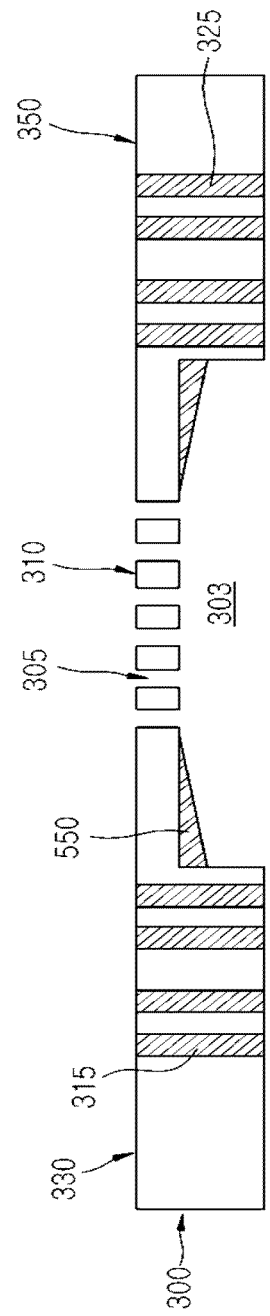
FIGS. 2-4 are cross-sectional views illustrating aspects of a semiconductor package according to an embodiment of the present invention.

The upper and lower substrates 300 and 400 may include an interposer substrate formed of silicon to provide the cavity 303 therein and to provide a suitable structure for the semiconductor package and heat radiation. The upper substrate 300 shown in FIG. 2 is combined with the lower substrate 400 shown in FIG. 3 as illustrated in FIG. 1. As illustrated in FIGS. 1 and 2, the upper substrate 300 may be formed using a through substrate via technique and a redistributed line (RDL) technique.

Referring to FIG. 2, the upper substrate 300 is provided to include the first through substrate vias 315 penetrating a first portion 330 thereof on which the first chip stack part 100 is mounted and the second through substrate vias 325 penetrating a second portion 350 thereof on which the second chip stack part 200 is mounted. A groove is formed by the separation part 310 between the first and second portions 330 and 350 to provide the cavity 303. A radiation part 305 is provided in the roof of the groove to emit the heat generated in the cavity 303. The radiation part 305 may be formed of any of various heat sinks, and is connected to the cavity 303. A heat spreader acting as a portion of the radiation part 305 may be additionally attached to the separation part 310 between the first and second portions 330 and 350.

In an embodiment, the radiation part 305 includes radiation holes that penetrate the roof of the cavity 303 to spatially connect the cavity 303 to the outside. The radiation part 305 including the radiation holes spatially connected to the cavity 303 may efficiently emit the heat generated from the optical communication part 500 to improve the thermal stability of the semiconductor package.

Figure 3:
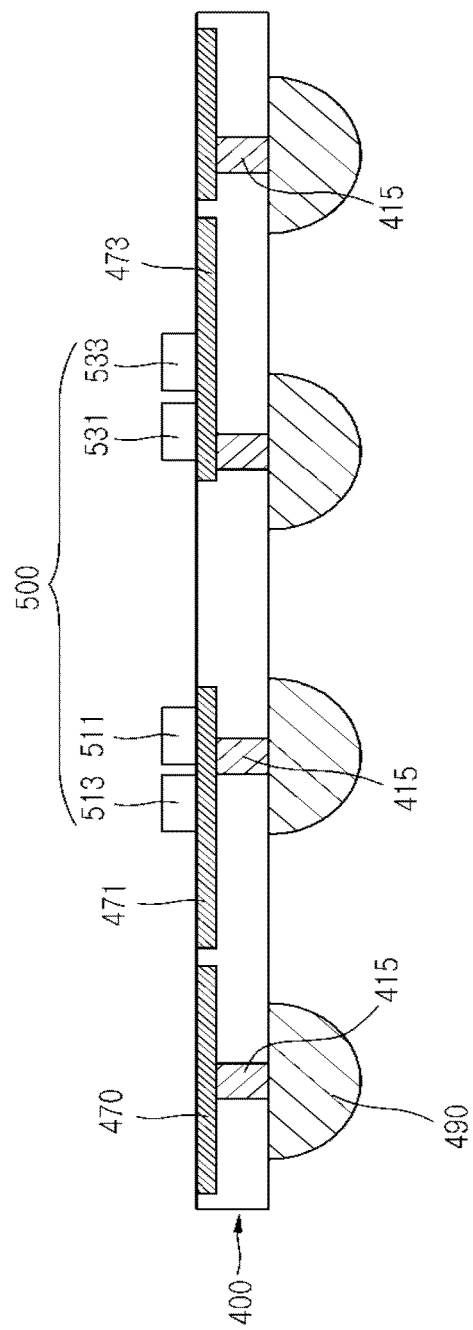

Referring to FIGS. 1 and 3, the lower substrate 400 combined with the upper substrate 300 may be fabricated using a through substrate via technique and a redistributed line (RDL) technique. The lower substrate 400 may be implemented using an interposer substrate formed of silicon. The interconnection lines including the interconnection lines 470, the first interconnection line 471, and the second interconnection line 473 are disposed on the lower substrate 400.

The first interconnection line 471 is disposed to be electrically coupled to the first through substrate vias 315 and the first optical transceiver 511 and 513, and the second interconnection line 473 is disposed to be electrically coupled to the second through substrate vias 325 and the second optical transceiver 531 and 533. Third through substrate vias 415 are disposed to penetrate the lower substrate 400.

The third through substrate vias 415 are electrically coupled to the interconnection lines 470, the first interconnection line 471, and the second interconnection line 473. The third through substrate vias 415 electrically couple the interconnection lines 470, 471, and 473 to external connection terminals 490 attached to a bottom surface of the lower substrate 400. The interconnection lines 470, 471, and 473 and the external connection terminals 490 are disposed on opposite sides of the lower substrate 400. The external connection terminals 490 may include ball grid array (BGA) solder balls.

Figure 4:
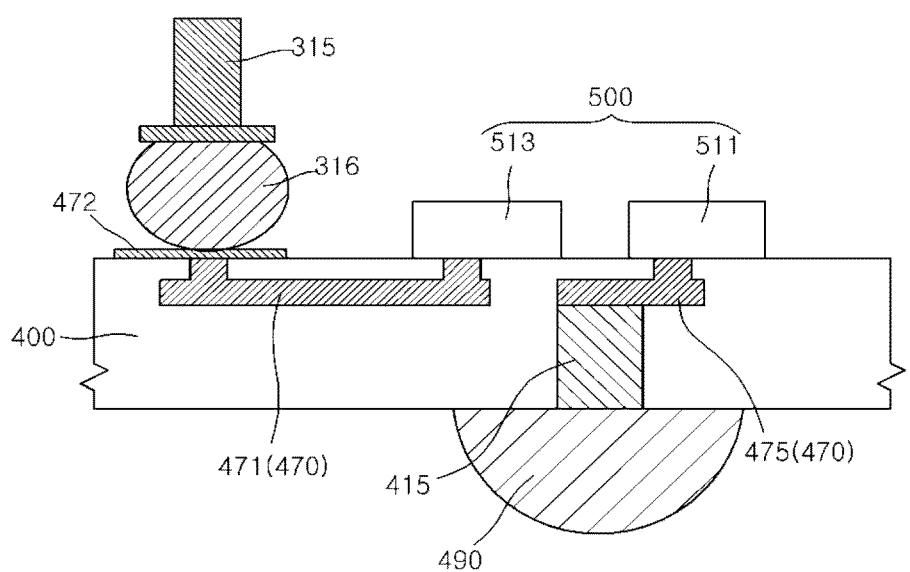

FIG. 4 illustrates an enlarged view of a part of the semiconductor package shown in FIG. 1 according to an embodiment. Referring to FIG. 4, the first optical transmitter 513 of the optical communication part 500 is electrically coupled to the first through substrate vias 315 through the first interconnection line 471 in the lower substrate 400. The first through substrate vias 315 are electrically coupled to signal pins of the first chip stack part 100. Specifically, the first optical transmitter 513 is electrically coupled to the first interconnection line 471, and the first interconnection line 471 is electrically coupled to the first through substrate vias 315 through a third joint conductor 316 and a contact pad 472. The third joint conductor 316 may include a micro solder ball or a bump. The first optical receiver 511 of the optical communication part 500 is electrically coupled to the external connection terminal 490 through a third interconnection line 475 of the interconnection lines 470 and the third through substrate via 415.

As described above, a semiconductor package according to an embodiment is configured to include the optical communication part 500 embedded in between the upper and lower substrates 300 and 400. The optical communication part 500 employs the optical signal path 501 as a signal transmission path between the first chip stack part 100 and the second chip stack part 200. Thus, an operation speed of the semiconductor package may be improved. Further, the optical signal path 501 may reduce a thermal stress generated due to the electrical resistance of the signal paths of the semiconductor package. Thus, the thermal stability of the semiconductor package may be improved because of the presence of the optical signal path 501.

Moreover, according to the embodiment, the protection layers 160 and 260 are disposed to surround sidewalls of the first and second semiconductor chips 140 and 240 but expose top surfaces of the first and second chip stack parts 100 and 200. The radiation part 305 including the radiation holes is disposed over the cavity 303 and between the first and second chip stack parts 100 and 200. As a result of this configuration, the heat generated in the semiconductor package may be efficiently emitted out of the semiconductor package.

In addition, signals of the semiconductor package can be transmitted through the optical signal path 501. Thus, even if the semiconductor package is scaled down to reduce a distance between electrical signal paths, interference or distortion of the signals may be suppressed. As a result, the reliability of the semiconductor package may be improved.

Figure 5:
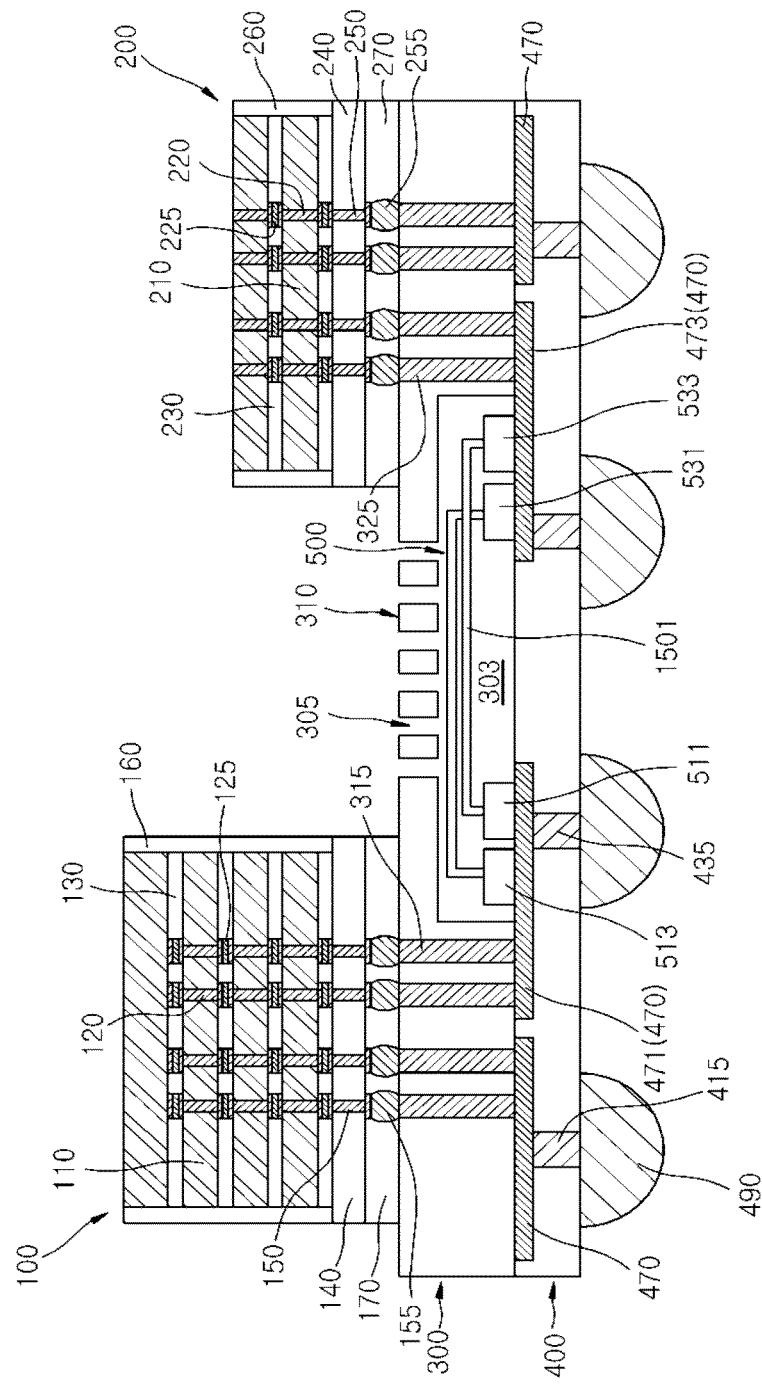
FIG. 5 is a cross-sectional view illustrating a semiconductor package according to another embodiment of the present invention.

FIG. 5 is a cross-sectional view illustrating a semiconductor package according to another embodiment of the present invention. In this embodiment, the semiconductor package includes optical fibers 1501 providing optical signal paths through which optical signals are transmitted, instead of the total reflectors 550 in FIG. 1 that are used to transmit optical signals.

The optical fibers 1501 are installed between a first optical transceiver 511 and 513 and a second optical transceiver 531 and 533 of an optical communication part 500 that is disposed in a cavity 303 provided between upper and lower substrates 300 and 400. In an embodiment, a first optical fiber of the optical fibers 1501 is coupled between the first optical receiver 511 and the second optical transmitter 533, and a second optical fiber of the optical fibers 1501 is coupled between the first optical transmitter 513 and the second optical receiver 531. Thus, optical signals of the optical communication part 500 are transmitted through the optical fibers 1501.

Figure 6:
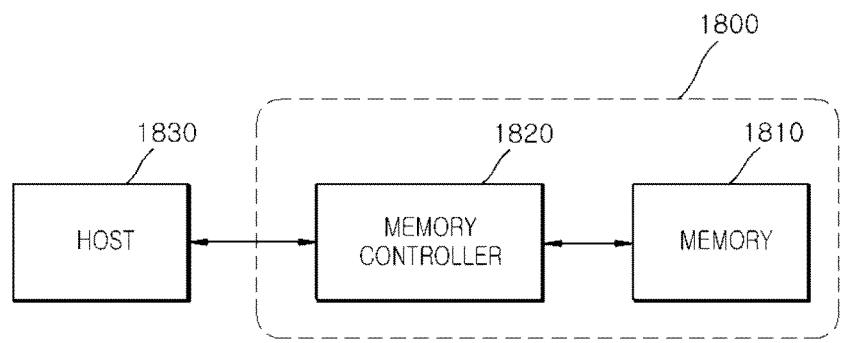
FIG. 6 is a block diagram illustrating an electronic system including a semiconductor package according to an embodiment of the present invention.

FIG. 6 is a block diagram illustrating an electronic system including a semiconductor package according to an embodiment of the present invention. In FIG. 6, the semiconductor package is provided in the form of a memory card 1800. The memory card 1800 includes a memory 1810 such as a nonvolatile memory device and a memory controller 1820. The memory 1810 may store data, and the memory controller 1820 may control data read/write operations of the memory 1810.

The memory 1810 may include at least one of nonvolatile memory devices that are packaged using a packaging technology according to an embodiment of the present invention. The memory controller 1820 may control the memory 1810 in response to a read/write request from a host 1830 such that data is read out of the memory 1810 or data is stored in the memory 1810.

Figure 7:
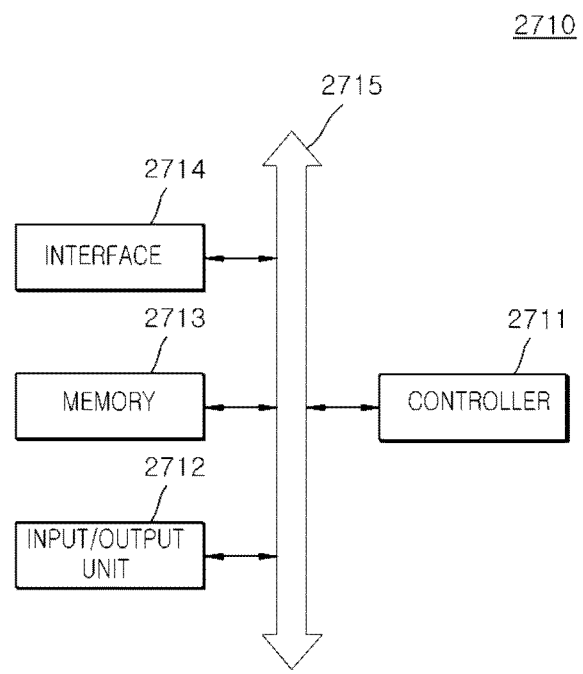
FIG. 7 is a block diagram illustrating an electronic system including a semiconductor package according to another embodiment of the present invention.

FIG. 7 is a block diagram illustrating an electronic system including a semiconductor package according to another embodiment of the present invention. The electronic system 2710 includes a controller 2711, an input/output unit 2712, and a memory 2713. The controller 2711, the input/output unit 2712, and the memory 2713 are coupled with one another through a bus 2715 providing a path through which data is transmitted. The memory 2713 and the controller 2711 may constitute a semiconductor package in accordance with an embodiment of the present invention.

In an embodiment, the controller 2711 includes one or more of at least one microprocessor, at least one digital signal processor, at least one microcontroller, and logic devices capable of performing substantially the same functions as the above components. The controller 2711 and the memory 2713 may include at least one semiconductor package according to an embodiment of the present invention. The input/output unit 2712 may include one or more of a keypad, a keyboard, a display device, a touch screen, and so forth. The memory 2713 is a device for storing data and/or commands to be executed by the controller 2711, or the like.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 2710 may stably store a large amount of data in a flash memory.

In an embodiment, the electronic system 2710 further includes an interface 2714 configured to transmit and receive data to and from a communication network. The interface 2714 may be a wired or wireless type. For example, the interface 2714 may include an antenna or a wired or wireless transceiver.

The electronic system 2710 may be implemented as a mobile system, a personal computer, an industrial computer, or a logic system performing various functions. The mobile system may be any one of a personal digital assistant (PDA), a portable computer, a tablet computer, a mobile phone, a smart phone, a wireless phone, a laptop computer, a memory card, a digital music system, and an information transmission/reception system.

In the case where the electronic system 2710 is an equipment capable of performing wireless communication, the electronic system 2710 may be used in a communication system such as one of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), and Wibro (wireless broadband Internet).

Embodiments of the present invention have been disclosed above for illustrative purposes. Those skilled in the art will appreciate that various modifications, additions and substitutions are possible, without departing from the scope and spirit of the present invention as disclosed in the accompanying claims.

What is claimed is:

1. A semiconductor package comprising:
a substrate;
a first chip stack structure and a second chip stack structure that are disposed over the substrate and are separate from each other;
an optical communication part including a first optical transceiver electrically coupled to the first chip stack structure and a second optical transceiver electrically coupled to the second chip stack structure, wherein the first and second optical transceivers are disposed to be faced with each other in a cavity which is formed in the substrate, and provides an optical signal path between the first and second chip stack structures; and
radiation holes disposed at a separation portion of the substrate, wherein the radiation holes are formed to pass through the separation portion so as to spread out heat that is generated from the first and second optical transceivers, and the separation portion of the substrate is disposed over the cavity and between the first and second chip stack structures.

2. The semiconductor package of claim 1,
wherein the optical communication part further includes a plurality of total reflectors which are disposed in the cavity to provide the optical signal path, and
wherein the plurality of total reflectors are aligned with the first and second optical transceivers.

3. The semiconductor package of claim 1, wherein the optical communication part further includes optical fibers which are disposed in the cavity and coupled to the first and second optical transceivers to provide the optical signal path between the first and second optical transceivers.

4. The semiconductor package of claim 1, further comprising:
first through substrate vias penetrating the substrate to electrically couple the first optical transceiver to the first chip stack structure; and
second through substrate vias penetrating the substrate to electrically couple the second optical transceiver to the second chip stack structure.

5. The semiconductor package of claim 1, wherein the first chip stack structure includes one or more memory chips that are stacked.

6. The semiconductor package of claim 5, wherein each memory chip is a DRAM chip.

7. The semiconductor package of claim 1, wherein the first chip stack structure includes a plurality of stacked memory chips which are electrically coupled to each other by through silicon vias (TSVs).

8. The semiconductor package of claim 1, wherein the second chip stack structure includes one or more logic chips that are stacked.

* * * * *